United States Patent [19]
Hoshino

[11] Patent Number: 4,855,781
[45] Date of Patent: Aug. 8, 1989

[54] CAMERA WITH BATTERY CHECK CIRCUIT
[75] Inventor: Yasushi Hoshino, Hachioji, Japan
[73] Assignee: Konica Corporation, Tokyo, Japan
[21] Appl. No.: 152,398
[22] Filed: Feb. 4, 1988
[30] Foreign Application Priority Data Feb. 5, 1987 [JP] Japan .................................. 62-25968
Feb. 5, 1987 [JP] Japan .................................. 62-25969

[51] Int. Cl.⁴ ............................................. G03B 17/18
[52] U.S. Cl. ..................................... 354/468; 354/484
[58] Field of Search ................................ 354/468, 484

[56] References Cited
U.S. PATENT DOCUMENTS

| 4,269,494 | 5/1981 | Shiozawa | 354/468 |
| 4,525,055 | 6/1985 | Yokoo | 354/468 |
| 4,662,736 | 5/1987 | Taniguchi et al. | 354/468 |
| 4,716,433 | 12/1987 | Alyfuku | 354/468 |
| 4,751,546 | 6/1988 | Yamamoto et al. | 354/468 |

FOREIGN PATENT DOCUMENTS

| 0046332 | 3/1983 | Japan | 354/468 |
| 0048025 | 3/1985 | Japan | 354/468 |

Primary Examiner—Russell E. Adams
Attorney, Agent, or Firm—Finnegan, Henderson, Farabow, Garrett & Dunner

[57] ABSTRACT

A camera includes an LCD, a microcomputer for detecting the presence/absence of a main power supply battery so as to detect an exchange of the main power supply battery, and a battery check circuit for detecting a voltage state of the main power supply battery. When the microcomputer detects the exchange of the main power supply battery, the battery check circuit is started to cause the LCD to display the voltage state of the main power supply battery.

4 Claims, 3 Drawing Sheets

CAMERA WITH BATTERY CHECK CIRCUIT

BACKGROUND OF THE INVENTION

1. FIELD OF THE INVENTION

The present invention relates to a camera comprising a battery check circuit capable of automatically measuring and displaying a voltage of a main power supply battery.

2. DESCRIPTION OF THE PRIOR ART

In recent compact cameras, in particular, compact 35 mm cameras, a battery is used not only for photometry and light emission of an electronic flash but also for driving a motor to perform a distance measurement operation and a film feed operation. In such cameras, if a loaded battery does not have a voltage exceeding a rated value, the camera cannot be used at all.

Therefore, in a camera having many automatic functions, a user must be able to check a voltage of a battery loaded in a camera. For this purpose, a battery check button is provided to almost all the cameras, or a so-called release switch is provided to an initial stroke of a release button to perform a battery check operation.

With this device solely, however, when a camera is not used for a long period of time, a user tends to forget to check a battery voltage. In this case, he or she often knows a battery voltage state immediately before a photographing operation, and if the voltage is below the rated value, replaces a battery in a flurry.

In particular, in a camera using AA type batteries as a power supply, since the batteries tend to be self discharged, if the camera is not used for a long period of time, the above case often occurs.

In order to solve the above problem, another camera is proposed wherein a sub power supply battery such as a lithium battery with a very stable voltage is incorporated in addition to the main power supply battery, and a battery check result of the main power supply battery is always displayed on, e.g., a liquid crystal display of a low current consumption type using the sub power supply battery.

However, since a battery check operation of the main power supply battery accompanies large current consumption, it must be intermittently executed at long time intervals. For this reason, even if the batteries are unloaded or are re-loaded in wrong polarities, a display state is not changed until the next battery check is performed.

Taking the above points into consideration, in a camera having a function of always displaying a voltage of a loaded main power supply battery on an external portion of the camera, or whether or not a battery is loaded with correct polarity must be discriminated. In addition, the camera must have a function of performing a battery check operation of the main power supply battery regardless of the time intervals to immediately display the check result when the battery is correctly loaded.

SUMMARY OF THE INVENTION

It is an object of the present invention to provide a camera comprising a battery check circuit which can repeatedly perform a check operation of a main power supply battery and a display operation of the check result periodically and immediately after the main power supply battery is correctly loaded.

It is another object of the present invention to provide a camera comprising a battery check circuit which can always perform a check operation in response to a stroke of a release button.

The above and other related objects and features of the invention will be apparent from a reading of the following description of the disclosure found in the accompanying drawings and the novelty thereof pointed out in the appended claims.

DETAILED DESCRIPTION OF THE PREFERRED EMBODIMENTS

The present invention will be described hereinafter with reference to the accompanying drawings.

Figure 1:
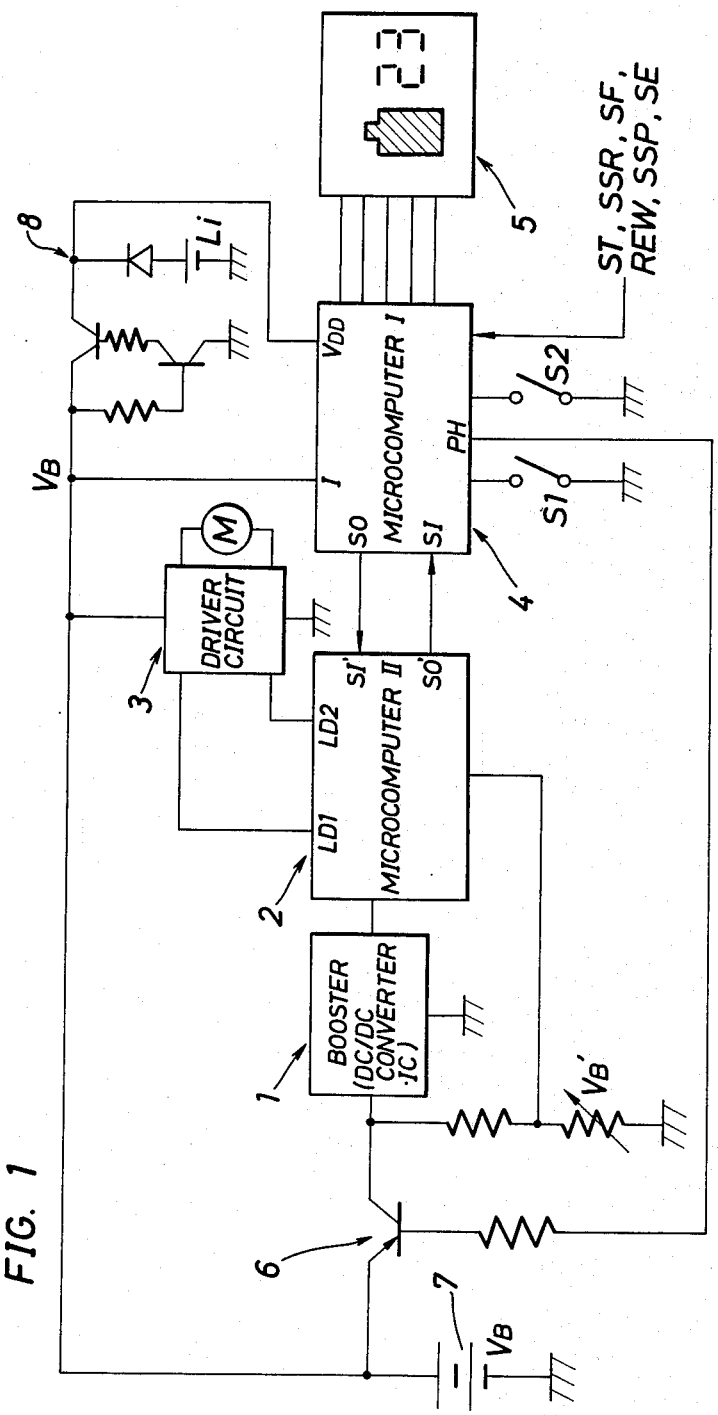
FIG. 1 is a circuit diagram showing a battery check circuit for a camera according to an embodiment of the present invention.

FIG. 1 is a circuit diagram of a camera concentrating on a battery check circuit and a display circuit therefor. In FIG. 1, reference numeral 1 denotes a booster using a DC/DC converter IC; 2, a control microcomputer (microcomputer II) with an A/D conversion function; 3, a driver circuit controlled by the control microcomputer (microcomputer II) 2; 4, a microcomputer (microcomputer I) incorporated in an LCD drive circuit; 5, an LCD serving as a battery display means; 6, a start transistor; 7, AA type batteries (3 V) as main power supply batteries, and 8, a lithium battery (3 V) as a sub power supply battery.

Reference symbols S1 and S2 denote switches which are turned on/off when a release button of the camera is operated. When the release button is slightly depressed to a first stroke, the switch S1 is turned on. When the release button is depressed still deeper, both the switches S1 and S2 are turned on. The LCD microcomputer 4 receives signals from various switches, e.g., an ST switch for operating a self timer, an SSR switch for causing the lens to perform a barrel collapse operation, an SF switch for detecting the presence/absence of a film, a REW switch for starting a film rewind operation, an SSP switch for outputting an ON/OFF signal each time one frame of a film is fed, an SE switch for detecting a barrel collapse position of the lens, and the like.

When AA type batteries 7 are normally loaded in a battery case without wrong polarities, an I terminal of the LCD microcomputer 4 (microcomuter I) as a detection means for detecting the presence/absence of batteries measures an open voltage $V_B$, and roughly discriminates if the voltage $V_B$ is higher than $\frac{1}{2}V_{DD}$, in this case, 1.5 V, i.e., performs a battery check (1). This discrimination is executed every second by a timepiece circuit (means) of the LCD microcomputer 4 (microcomputer I) without consuming a current of the AA type batteries 7 since an open voltage is simply measured utilizing a threshold voltage of a C-MOS.

As a result of the battery check (1), if it is determined that the voltage is higher than 1.5 V, the LCD microcomputer 4 (microcomputer I) is power-held after a predetermined period of time has been measured by the timepiece circuit (means), thus starting the booster 1 and the control microcomputer 2 (microcomputer II)

through the start transistor 6 in accordance with an output from a terminal PH of the LCD microcomputer 4.

As a result, terminals LD1 and LD2 control the driver circuit 3 to cause a constant current to flow through a motor M. During the control operation, the microcomputer 2 measures a voltage $V_B'$, and transfers the measurement result to the LCD microcomputer 4 (microcomputer I) through terminals SI' and SO'. Then, the measured voltage level is displayed on the LCD 5. More specifically, a battery check (2) is performed. In this case, detection precision is very high since the voltage is measured by 8 bits of the control microcomputer 2 (microcomputer II), i.e., in units of 1/256. In a practical application, the measured voltage is displayed using one of three patterns shown in FIGS. 2(a) to 2(c).

Figure 2A:
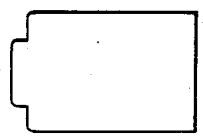
FIGS. 2(a) to 2(c) are views illustrating examples of battery capacity display patterns.
Figure 2B:
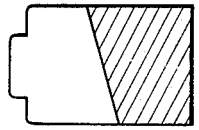
Figure 2C:
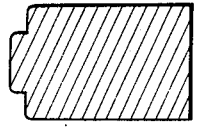

More specifically, FIG. 2(a) shows a pattern displayed on the LCD when the voltage is higher than 2.6 V; FIG. 2(b) shows a pattern when the voltage falls within the range of 2.6 to 2.4 V, and FIG. 2(c) shows a pattern when the voltage is lower than 2.4 V. Each time the battery check (2) (to be described later) is performed at 24-hour intervals, the above pattern is updated, and new data is displayed.

Meanwhile, as a result of the battery check (1), if it is determined that the voltage is lower than 1.5 V, the LCD 5 displays the pattern shown in FIG. 2(c), and the battery check (2) is not executed. Thus, all the operations of the camera are inhibited as will be described later with reference to a sequence.

Figure 3:
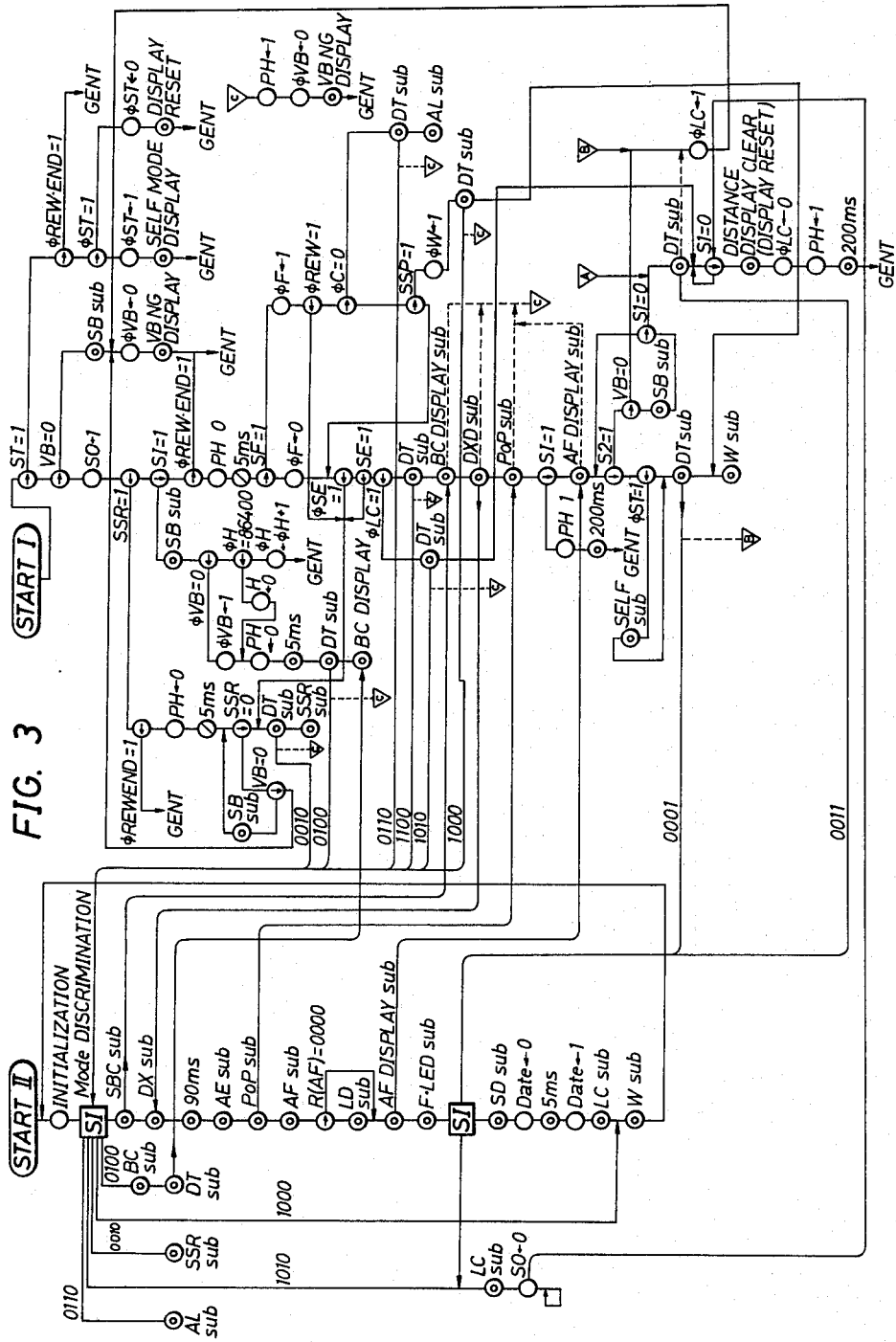
FIG. 3 is a program showing an operation sequence of a camera according to the present invention.

When new batteries having a voltage of 1.5 V or higher are loaded, the battery check (2) is executed once immediately thereafter since flag $\phi VB=0$, as shown in the program of FIG. 3. Then, flag $\phi VB$ is set to be "1", and the battery check (2) is periodically performed upon resetting of the timepiece circuit (means), i.e., when flag $\phi H$ overflows.

The camera according to the present invention also has a function of the battery check (3) executed by a switch means, i.e., a switch S1, which is operated by an initial stroke of a release button in addition to the battery checks (1) and (2). In this case, when the release button is slightly depressed to turn on the switch S1, the booster 1 and the control microcomputer 2 (microcomputer II) are operated through the start transistor 6 independently of the timepiece circuit (means) for the battery check (2) to perform the same high-precision voltage measurement as in the battery check (2). The check result can be displayed on the LCD 5 prior to the result of the battery check (2).

Therefore, when a large number of photographing operations are performed within a short period of time, a degree of battery consumption can be detected in a real time manner.

Figure 4:
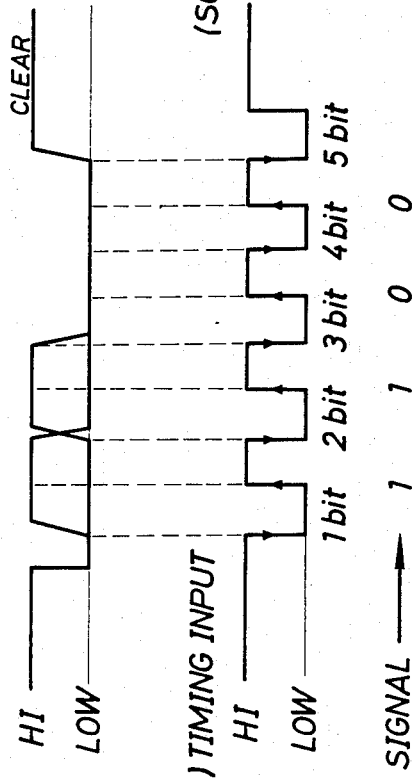
FIG. 4 is a timing chart showing a data transmission method between microcomputers.

The sequence of the overall battery check operation of the camera according to the present invention will be described with reference to FIG. 3. FIG. 4 shows a data or information transfer method between the microcomputers I and II during the above sequence.

As has been described above, the camera of the present invention comprises the first microcomputer I for checking I/0 states of switches sequentially generated by the release operation and discriminating and selecting an operation to be followed next, and the second microcomputer II for driving and controlling the respective mechanism sections of the camera based on data from the microcomputer I and feeding back data to the microcomputer I. The microcomputer I executes a sequence following START I in the flow chart shown in FIG. 3, and the microcomputer II executes a sequence following START II while exchanging data with each other.

Data transfer between the microcomputers I and II is performed as follows.

When one of the microcomputers I and II establishes a data output enable state, the one microcomputer receives a pulse signal for determining a data output timing from the other microcomputer, and outputs data in synchronism with the pulse signal, thereby serially transferring data to the other microcomputer.

FIG. 4 shows data exchange when a main routine follow signal (1100) (to be described later) is transferred from the microcomputer I to the microcomputer II. During mode discrimination, a data output terminal (SO) of the microcomputer I is set at "HI" level. After the discrimination is completed, the data output terminal goes to "LOW" level to establish a data output enable state. However, in this case, since a timing input terminal (SI) is set at "HI" level, no data is output, and the microcomputer I is kept in a standby state.

The microcomputer II detects that the terminal (SO) of the microcomputer I is changed to "LOW" level, and sends a 5-bit pulse signal to the terminal (SI) of the microcomputer I. Therefore, when the terminal (SI) of the microcomputer I goes to "LOW" level, i.e., in response to the trailing edge of the 1st bit of the pulse signal, a data "1" signal is output.

When the terminal (SI) of the microcomputer I goes to "HI" level, i.e., in response to the leading edge of the 1st bit, the microcomputer II fetches the data "1" signal at a data input terminal (SI).

Subsequent data "1", "0", and "0" are serially transferred to the data input terminal (SI) of the microcomputer II in response to the 2nd, 3rd, and 4th bits of the pulse signal in the same manner as described above. Thereafter, in response to the 5th bit of the pulse signal, these data are cleared, thus ending data exchange.

When data is transferred from the microcomputer II to the microcomputer I, data I/0 and timing I/0 functions are exchanged, and (SO) of the microcomputer II serves as a data output terminal, (SI) thereof serves as a timing input terminal, (SO) of the microcomputer II serves as a timing output terminal, and (SI) thereof serves as a data input terminal. Thus, the same data transfer as described above is performed.

In addition to the above-mentioned I/0 check operations of the switches, the microcomputer I drives the LCD to display data associated with a photographing operation, such as a film counter, a battery capacity, a self timer mode, and the like. The microcomputer I adopts a 3 V lithium battery as a power supply, and is started in response to the setting operation of a self timer mode, a barrel collapse operation of the lens, a release operation, or an operation of a 1-sec timer arranged separately. The microcomputer II can perform 4-channel A/D conversion, and executes automatic photometry, a drive operation of an automatic focusing operation, a film windup operation, a film rewind operation, a barrel collapse operation of the lens, a battery check operation, disconnection detection of a shutter coil, and the like. The microcomputer II adopts two AA type batteries as a power supply, and is started in response to data transfer from the microcomputer I.

Microcomputers having a ROM capacity and drive capability or number of I/0 terminals depending on an application can be selected from versatile ones as two microcomputers I and II. In this manner, a special-purpose microcomputer need not be developed for each product, and an inexpensive and effective controller can be provided.

The flow chart shown in FIG. 3 is constituted by a first main routine following START I downward, a second main routine following START II downward, and subroutines branching from the respective main routines. A sequence for inhibiting a photographing operation or for satisfying conditions is executed in accordance with data obtained by following the respective subroutines, and a normal photographing operation can be performed.

Note that symbols used in the flow chart are defined as follows:
- ◊ ... decision (if a condition next to the symbol is satisfied, the flow advances in a direction of arrow)
- ⊙ ... subroutine
- ○ ... processing (processing next to the symbol is executed)
- ⌀ ... timer set A self timer operation, the sequence of which is advanced only by the routines of the microcomputer I, will be described first. When a self timer button is operated (ST=1) prior to the release operation, it is checked if the film rewind operation is completed. If the film rewind operation is completed ($\phi RE-END=1$), all the operations including warning and displaying operations of the LCD are inhibited (GENT) to cause a user to open a rear cover, i.e., to exchange films. If the film rewind operation is not completed, the state of the self timer button is checked (®ST=1). If the self timer button is not operated again, a self timer mode is set ($\phi ST \leftarrow 1$), and the LCD is driven to display the self timer mode.

The self timer mode set as described above is started by a second stroke (S2=0) of the release button (to be described later). More specifically, if $\phi ST=1$ when S2=0, a time control operation in accordance with a subroutine (SELF sub) is completed, and a signal (0001) is transferred from a data transfer sub(DT sub) to a data transfer sub ⑤Ⅱ of the microcomputer II, thereby executing a shutter operation subroutine (SD sub).

When the self timer button is again depressed ($\phi ST=1$) during the SELF sub, the self timer mode is canceled ($\phi ST=0$), the sequence is interrupted, and display on the LCD is canceled.

In the camera of the present invention, when the self timer button is operated an odd number of times, the self timer mode is set, and when it is operated an even number of times, the mode can be canceled.

The battery check (1) subsequent to ST discrimination is a rough battery check method utilizing a threshold voltage of a C-MOS and checks if the voltage of the AA type batteries is higher than 1.5 V ($\frac{1}{2}V_{DD}$). More specifically, if a voltage VB which is input from the main power supply battery 7 to the terminal I of the microcomputer I is equal to or higher than 1.5 V, VB=1 is established, and if it is lower than 1.5 V, VB=0 is established. With this function, the presence/absence of batteries can be easily discriminated from a camera section.

The camera of the present invention has a function of performing a battery check in response to a release operation as in a conventional camera and displaying the result. In addition, since the 1-sec timer enables the microcomputer I, the battery check can be performed upon operation of the 1-sec timer when the camera is not used. When the battery capacity is short ($V_B=0$), flag $\phi VB$ is set to be "0" ($\leftarrow VB \leftarrow 0$), and a short in capacity is displayed on the LCD (VBNG display) to inhibit the operation of the microcomputer I (GENT), thus disabling the operation of the camera. With this control operation, an erroneous operation of the microcomputer II caused by a short in capacity of the AA type batteries can be prevented.

Thereafter, when the main routine of the microcomputer I is executed, data transfer with the microcomputer II is executed. Therefore, as preparation for data transfer, the data transfer terminal SO of the microcomputer I is set at H level (SO←1).

The microcomputer I can be started in response to an operation of the barrel collapse switch (SSR=1), as described above. If the film rewind operation is completed ($\phi REW-END=1$), the microcomputer I is disabled. However, if the rewind operation is not completed, the microcomputer I is power-held (PH←0). If the barrel collapse switch is canceled (SSR=0) after 5 msec required for starting the microcomputer II have passed, a signal (0010) is transferred from the data transfer sub(DT sub) to the data transfer sub ⑤Ⅱ of the microcomputer II in accordance with a subroutine (SSR sub), thereby starting the barrel collapse operation.

When the barrel collapse switch is kept ON (SSR=1), the battery check and an operation for discriminating if the rear cover is opened are repeatedly executed. When the battery capacity is short, the barrel collapse operation is not started. When the rear cover is opened, the LCD display is cleared to an initial state. After the barrel collapse switch is canceled, the barrel collapse operation is started.

A case will be described wherein the battery check circuit is enabled in response to the release operation. When the switch (S1) is ON (S1=1) in response to the first stroke of the release button, the first main routine after START I is executed, and in the next step, the film rewind state is checked.

However, if the release button is not operated and the switch (S1) is kept OFF (S1=0), only the battery check can be executed by the 1-sec timer.

First, a case will be described wherein the main power supply battery is exchanged. When the main power supply battery is unloaded, the microcomputer I determines that VB=0. Therefore, flag $\phi VB$ is set to be "0" ($\phi VB \leftarrow 0$). If a new battery is loaded, VB=1 is established. Therefore, if VB=1 and $\phi VB=0$, it can be determined that the battery is exchanged. Thus, if ($\phi VB=0$) after the flag is cleared (SB sub), since (VB=1) has already been confirmed, this indicates that batteries are exchanged. For this reason, ($\phi VB \leftarrow 1$) is set, and power hold (PH←0) is performed so as to execute the normal battery check (2) capable of detecting the capacity, i.e., 3 V voltage of the AA type batteries by 8 bits, i.e., in units of 1/256. Thereafter, a signal (0100) is transferred from the data transfer sub(DT sub) to the data transfer sub ⑤Ⅱ of the microcomputer II to perform the battery check in accordance with a subroutine (BC sub). The check result is fed back to the microcomputer and is displayed on the LCD.

If the batteries are not exchanged ($\phi VB=1$), since the AA type batteries are easily self-discharged, when a camera is not used for a long period of time, the battery check must be periodically performed to sequentially update a battery display. For this reason, the normal battery check is preferably performed once a day.

Flag φH which continues a count-up operation utilizing the 1-sec timer and overflows when the count has reached 86400 (24 hours) is prepared. If 24 hours are not yet reached, flag φH is incremented (φH←φH+1), and the microcomputer I is not operated (GENT). However, when 24 hours have been reached (φH=86400), the timer overflows, and the flag is cleared (H←0). Thereafter, the above-mentioned normal battery check (2) and the display operation therefor are performed.

When control returns to the initial main routine and the film rewind operation is completed (φREW-END=1), the sequence enters the subroutine upon discrimination of the microcomputer I prestoring the flag states, thereby inhibiting the subsequent release operation. If the rewind operation is not completed (φREW-END=0), the microcomputer II is started by the subsequent power hold (PH←0) to be set in a data transfer enable state.

Since the microcomputer II requires a small rise time, after 5 msec have passed, film detection is performed. If a film is detected (SF=1), the microcomputer I determines that the film is present (φF←1), and the check operation in accordance with the subroutine progresses.

More specifically, even if the film is present, if the rewind operation is being performed (φREW=1), the rewind operation (to be described later) is started; otherwise, the film counter and the film windup state are checked. If the counter is 0, (φC=0), i.e., auto loading is started, a signal (0110) is transferred from the data transfer sub(DT sub) to the data transfer sub SI of the microcomputer II. Then, the auto loading operation of the film is performed in accordance with a subroutine (AL sub) to set the film in a normal state. On the other hand, if one frame of the film is being wound (SSP=1), a signal (1000) is transferred in the same manner described above. Then, the remaining windup operation is performed in accordance with a subroutine (W sub).

Note that since display of the film counter is updated to the next frame even if the film windup operation is interrupted, flag (φW←1) is discriminated in the subroutine (W sub) so as not to update the display of the film counter by the remaining windup operation described above.

If it is determined that the film is absent (φF←0), the main routine is also executed, and the barrel collapse state of the lens is checked.

When the lens is stopped during the barrel collapse operation due to erroneous operation such as unloading of a battery during a camera operation and the microcomputer I determines that the barrel collapse operation is not completed (φSE=1) upon comparison with the prestored flag, or when a mechanical switch is ON (SE=1) caused by the above result, control for the barrel collapse operation is executed in accordance with a subroutine (SSR sub). In this case, if the lens is located at a predetermined barrel collapse position (φSE=0, SE=0), it is subsequently checked if the lens is located at an initial position of the focusing operation.

When the lens is not located at the initial position of the focusing operation due to the similar erroneous operation to above (φLC=1), a sequence similar to that for returning the lens to the initial position upon discrimination of S1=0 (OFF) performed by the second stroke of the release operation is started in response to a signal (1010). However, when the lens is correctly set at the predetermined initial position (φLC=0), the microcomputer I serially transfers the mode discrimination result as 4-bit data based on the above-mentioned data from (SO) to the microcomputer II.

More specifically, in order to reach the main routine as the photographing sequence, only when a mode other than the barrel collapse or rewind operation (0010), the battery check (0100), the auto loading operation of a film (0110), the film windup operation (1000), and a charge operation of the lens to the initial position (1010), a main routine follow command is input, as a signal (1100), to the SI of a sequence after START II.

Since the microcomputer II is initialized, i.e., power-held in advance, it immediately starts to follow the main routine starting from START II upon reception of the data transfer from the microcomputer I.

When the battery check result, ON or OFF of the main switch, and the result of disconnection check of the shutter coil are sent from the main routine of the microcomputer II as data in accordance with a subroutine (SBC sub) and these conditions are satisfied, the microcomputer I displays a battery capacity in accordance with a subroutine (BC display sub), and reads a film speed in accordance with a subroutine (DXD sub). Then, the microcomputer I transfers the read data and a discrimination result of a Tele or Wide state to the microcomputer II.

The microcomputer II takes 90 msec for setting conditions associated with exposure control such as charging of a light emitting capacitor for distance measurement, and thereafter, performs photometry in accordance with a subroutine (AE sub). The photometric result causes an electronic flash to pop up based on a subroutine (POP sub) if necessary, and charging data is fed back to the microcomputer I to inhibit the release operation until the charging operation is completed in accordance with the subroutine (POP sub).

Subsequently, the microcomputer I re-checks the state of the switch (S1). If the switch (S1) is OFF (S1=0), the sequence is interrupted. However, if the switch is kept ON (SI=1), the distance measurement result based on a subroutine (AF sub) of the microcomputer II and a lens control position based on a subroutine (LD sub) are fed back to the microcomputer I, and are displayed in accordance with a subroutine (AF display sub). However, if the distance measurement result represents that an object is too close to perform control, the sequence by the microcomputer I is interrupted by (RAF[AF]=0000).

The re-check operation of the switch (S1) is to interrupt the sequence by the microcomputer I immediately before lens control by the subroutine (LD sub) in order to inhibit a lens mechanical operation if the switch (S1) is instantaneously ON by an erroneous operation, and to follow the main routine of the microcomputer I only when the switch (S1) is kept ON.

After the AF display operation, the power supply ($V_B$) of the microcomputer II and the state of the rear cover of the camera are checked (SB sub) upon ON operation (S2=1) in response to the second stroke of the release operation. If the AA type batteries are erroneously unloaded ($V_B$=0), the sequence by the microcomputer I is interrupted and the LCD is cleared. Meanwhile, if the switch (S1) is OFF (S1=0), a signal for returning the lens to the initial position is transferred to the microcomputer II through a channel (0011), and at the same time, the SI is set at signal level "LOW" (SI=0). Then, when the of the distance measurement result and the lens is returned to the initial position, flag (φLC←0) is cleared, and the power hold state is canceled (PH←1). Thereafter, the sequence of the microcomputer I is interrupted.

However, if the above-mentioned abnormality is not detected and the switch (S2) is ON (S2=1), the self timer mode is checked. If the flag indicates the self timer mode ($\phi ST=1$), a predetermined period of time is delayed based on a subroutine (SELF sub). However, if the self timer mode is not set ($\phi ST=0$), a signal (0001) for driving the shutter is transferred to the S1 of the sequence of the microcomputer II.

When the microcomputer II performs the shutter operation and control (SD sub) and date printing (Date←1), it returns the lens to the initial position of the focusing operation (LC sub). When the microcomputer II starts the film windup operation (W sub), the microcomputer I detects that one frame is wound, and transfers a signal representing this to the microcomputer II. Then, the film windup operation is stopped, and all the sequence is ended.

As can be seen from the above description, the camera according to the present invention has three check means, i.e., the battery checks (1), (2), and (3) described above. Therefore, whether or not batteries are correctly loaded can be discriminated, a voltage of the loaded battery can always be displayed without accompanying large current consumption, and the display can be updated and checked each time the photographing operation is performed.

According to the present invention, a camera comprising a battery check circuit can be provided wherein whether or not batteries having an effective voltage serving as a main power supply are correctly loaded in the camera can be externally checked, and during a long nonuse period of a camera, display of a voltage can always be continued without consuming a large current.

It should also be understood that the foregoing relates to only a preferred embodiment of the invention, and that it is intended to cover all changes and modifications of the example of the invention herein chosen for the purposes of the disclosure, which do not constitute departures from the spirit and scope of the invention.

What is claimed is:

1. A camera battery check circuit, comprising:
    first detection means for detecting the presence or absence of a main power supply battery at first predetermined intervals and generating first and second signals in response to the detection of the presence or absence, respectively, of the main power supply battery;
    second detection means for detecting the voltage level of said main power supply battery in response to said first signal and thereafter detecting said voltage state at second predetermined intervals, said second predetermined intervals being longer than said first predetermined intervals;
    display means for displaying the voltage level of said main power supply battery and for indicating the presence or absence of said main power supply battery in response to said first and second signals, respectively; and
    a sub power supply battery for supplying power to said display means and said first detection means.

2. A battery circuit according to claim 1, further including a release button, for generating an enabling signal when the release button is operated, said second detection means detecting said voltage level of said main power supply battery in response to said enabling signal.

3. A battery check circuit according to claim 1, further comprising means for establishing a threshold voltage, wherein said first detection means generates said first signal when the voltage of said main power supply battery exceeds said threshold voltage and generates said second signal when the voltage of said main power supply battery is less than said threshold voltage.

4. A battery check circuit according to claim 1, wherein the first predetermined interval is about one second and said second predetermined interval is about 24 hours.

* * * * *